(12) United States Patent
Su et al.

(10) Patent No.: US 9,707,706 B2
(45) Date of Patent: Jul. 18, 2017

(54) FLEXIBLE SUBSTRATE EMBEDDED WITH WIRES AND METHOD FOR FABRICATING THE SAME

(71) Applicant: INDUSTRIAL TECHNOLOGY RESEARCH INSTITUTE, Hsinchu (TW)

(72) Inventors: Chun-Wei Su, New Taipei (TW); Chyi-Ming Leu, Jhudong Township (TW); Yu-Ju Kuo, New Taipei (TW); Hong-Ching Lin, Kaohsiung (TW); Chun-An Lu, New Taipei (TW); Chiung-Hsiung Chen, Zhudong Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 174 days.

(21) Appl. No.: 14/627,913

(22) Filed: Feb. 20, 2015

(65) Prior Publication Data

US 2015/0245470 A1    Aug. 27, 2015

Related U.S. Application Data

(60) Provisional application No. 61/944,279, filed on Feb. 25, 2014.

(30) Foreign Application Priority Data

Dec. 29, 2014 (TW) .............................. 103145994 A

(51) Int. Cl.
  *B29C 39/02*   (2006.01)
  *H05K 3/20*    (2006.01)
  (Continued)

(52) U.S. Cl.
  CPC ............ *B29C 39/02* (2013.01); *B29C 39/003* (2013.01); *H05K 3/207* (2013.01); *B29C 35/02* (2013.01);
  (Continued)

(58) Field of Classification Search
  None
  See application file for complete search history.

(56) References Cited

U.S. PATENT DOCUMENTS 4,024,046 A    5/1977  Lupinski et al.
4,056,161 A *  11/1977  Allen, Jr. ............. G10K 11/168
                                                        181/290

(Continued)

FOREIGN PATENT DOCUMENTS

JP    4-276686 A     10/1992
JP    2002-9202 A    1/2002
(Continued)

OTHER PUBLICATIONS

Akamatsu et al., "Fabrication of Silver Patterns on Polyimide Films Based on Solid-Phase Electrochemical Constructive Lithography Using Ion-Exchangeable Precursor Layers", Langmuir, 2011, pp. 11761-11766, vol. 27.

(Continued)

*Primary Examiner* — Muhammed Azam
(74) *Attorney, Agent, or Firm* — Birch, Stewart, Kolasch & Birch, LLP

(57) ABSTRACT

A flexible substrate embedded with wires includes a flexible substrate constituted by a polymer material, and a continuous wire pattern containing a plurality of pores embedded in the flexible substrate, wherein the polymer material fills the pores. A method for fabricating a flexible substrate embedded with wires providing a carrier; forming a continuous wire pattern on the carrier, the continuous wire pattern (Continued)

containing a plurality of pores; covering a polymer material over the continuous wire pattern and the carrier and to fill into the pores; and separating the polymer material and the carrier to form a flexible substrate embedded with the continuous wire pattern" where the only change is the addition of wires.

13 Claims, 3 Drawing Sheets

(51) Int. Cl.
*B29C 39/00* (2006.01)
*B29C 35/02* (2006.01)
*B29L 31/34* (2006.01)
*B29K 27/00* (2006.01)
*B29K 79/00* (2006.01)
*B29K 505/00* (2006.01)

(52) U.S. Cl.
CPC ...... *B29K 2027/16* (2013.01); *B29K 2079/08* (2013.01); *B29K 2505/00* (2013.01); *B29K 2995/0005* (2013.01); *B29L 2031/3425* (2013.01); *H05K 2201/0154* (2013.01); *H05K 2201/2072* (2013.01); *H05K 2203/1131* (2013.01)

(56) References Cited

U.S. PATENT DOCUMENTS

| | | | |
|---|---|---|---|
| 4,184,001 A | 1/1980 | Hildreth | |
| 4,336,221 A * | 6/1982 | Garabedian | B29C 33/10 264/122 |
| 4,404,237 A * | 9/1983 | Eichelberger | H05K 3/246 338/308 |
| 4,447,797 A * | 5/1984 | Saunders | H01B 3/40 174/110 E |
| 4,650,545 A | 3/1987 | Laakso et al. | |
| 4,980,016 A | 12/1990 | Tada et al. | |
| 5,036,128 A * | 7/1991 | Durand | C09D 11/101 428/323 |
| 5,245,151 A * | 9/1993 | Chamberlain | B29C 65/1425 174/41 |
| 5,412,160 A * | 5/1995 | Yasumoto | H01L 23/3731 174/258 |
| 5,439,636 A * | 8/1995 | Bezama | H01L 21/4807 156/155 |
| 5,731,086 A * | 3/1998 | Gebhardt | B29C 43/021 428/212 |
| 5,928,575 A * | 7/1999 | Buazza | B29D 11/00865 264/1.38 |
| 5,928,767 A * | 7/1999 | Gebhardt | B32B 15/08 174/258 |
| 6,052,286 A * | 4/2000 | Worthen | H01R 4/04 257/703 |
| 6,197,450 B1 * | 3/2001 | Nathan | H01G 9/016 29/623.1 |
| 6,221,440 B1 | 4/2001 | Meyer et al. | |
| 6,265,321 B1 | 7/2001 | Chooi et al. | |
| 6,981,317 B1 * | 1/2006 | Nishida | H01L 21/563 257/E21.503 |
| 6,989,230 B2 | 1/2006 | Lu | |
| 7,683,651 B2 | 3/2010 | Chanda et al. | |
| 7,758,927 B2 | 7/2010 | Miner et al. | |
| 8,449,978 B2 | 5/2013 | Honda et al. | |
| 8,454,859 B2 | 6/2013 | Lowenthal et al. | |
| 8,587,946 B2 * | 11/2013 | Lee | G06F 1/183 361/705 |
| 9,236,169 B2 * | 1/2016 | Hong | H05K 1/0218 |
| 2001/0007788 A1 | 7/2001 | Chang et al. | |
| 2002/0090794 A1 | 7/2002 | Chang et al. | |
| 2003/0128496 A1 * | 7/2003 | Allen | H01G 4/06 361/306.3 |
| 2003/0186172 A1 | 10/2003 | Lu | |
| 2003/0216026 A1 | 11/2003 | Mukherjee-Roy et al. | |
| 2004/0101626 A1 * | 5/2004 | Kanada | C08J 9/26 427/385.5 |
| 2004/0183209 A1 | 9/2004 | Lin | |
| 2005/0121804 A1 | 6/2005 | Kuo et al. | |
| 2005/0276912 A1 * | 12/2005 | Yamamoto | H01L 21/28008 427/117 |
| 2006/0023154 A1 * | 2/2006 | Harada | G02F 1/13452 349/149 |
| 2006/0163744 A1 * | 7/2006 | Vanheusden | B82Y 30/00 257/773 |
| 2006/0182881 A1 * | 8/2006 | Montano | C23C 18/1893 427/162 |
| 2007/0287023 A1 * | 12/2007 | Jackson | C23C 26/00 428/624 |
| 2008/0063838 A1 * | 3/2008 | Kurihara | H01L 23/4985 428/141 |
| 2008/0107867 A1 * | 5/2008 | Miekka | H05K 1/0203 428/141 |
| 2009/0108855 A1 | 4/2009 | Chanda et al. | |
| 2009/0246474 A1 * | 10/2009 | Sakurai | H01L 21/563 428/172 |
| 2010/0002402 A1 * | 1/2010 | Rogers | H01L 21/4867 361/749 |
| 2011/0256338 A1 * | 10/2011 | Ausen | B29C 43/003 428/100 |
| 2011/0267825 A1 * | 11/2011 | Hotta | C25D 11/04 362/296.02 |
| 2012/0074094 A1 * | 3/2012 | Chiang | H01L 21/4846 216/18 |
| 2012/0168211 A1 * | 7/2012 | Lu | B82Y 30/00 174/257 |
| 2013/0004729 A1 * | 1/2013 | Ausen | B29C 47/062 428/172 |
| 2014/0239504 A1 * | 8/2014 | Yau | G02F 1/13439 257/773 |
| 2015/0208509 A1 * | 7/2015 | Sakai | H05K 3/323 361/751 |
| 2015/0313008 A1 * | 10/2015 | Spath | H05K 1/097 345/174 |

FOREIGN PATENT DOCUMENTS

| | | |
|---|---|---|
| JP | 2003-60324 A | 2/2003 |
| JP | 310246 U | 6/2004 |
| JP | 2007/150180 A | 6/2007 |
| JP | 2009-94191 A | 4/2009 |
| TW | 367580 | 8/1999 |
| TW | I286571 | 9/2005 |
| TW | I243478 | 11/2005 |
| TW | 200605344 | 2/2006 |
| TW | 200929720 | 7/2009 |
| TW | 2010029245 A1 | 8/2010 |
| TW | 201205069 A1 | 2/2012 |

OTHER PUBLICATIONS

Akamatsu et al., "Site-Selective Direct Silver Metallization on Surface-Modified Polyimide Layers", Langmuir, 2003, pp. 10366-10371, vol. 19.

Mahajan et al., "Facile Method for Fabricating Flexible Substrates with Embedded, Printed Silver Lines", American Chemical Society, Appl. Mater. Interfaces, 2014, pp. 1306-1312, vol. 6.

Menicanin et al., "Transport Parameters of Inkjet Printed Nanoparticle Silver on Polyimide Substrate Measured at Room and Liquid Nitrogen Temperatures", IEEE Transactions on Electron Devices, Sep. 2013, pp. 2963-2967, vol. 60, No. 9.

Sondergaard et al., "Roll-to-Roll Fabrication of Large Area Functional Organic Materials", Journal of Polymer Science Part B: Polymer Physics, 2013, pp. 16-34, vol. 51.

* cited by examiner

FLEXIBLE SUBSTRATE EMBEDDED WITH WIRES AND METHOD FOR FABRICATING THE SAME

CROSS REFERENCE TO RELATED APPLICATIONS

This Application claims the benefit of U.S. Provisional Application No. 61/944,279, filed on Feb. 25, 2014, and priority of Taiwan Patent Application No. 103145994, filed on Dec. 29, 2014, the entireties of which are incorporated by reference herein.

TECHNICAL FIELD

The technical field relates to a flexible substrate embedded with wires and a method for fabricating the same.

BACKGROUND

Currently, flexible printed circuit boards mainly rely on flexible copper clad laminates (FCCL) which are classified into non-adhesive flexible copper clad laminates (2-layer FCCL) and adhesive flexible copper clad laminates (3-layer FCCL) by the number of layers, and the greatest difference between those two is whether there is an adhesive between a copper foil and a polyimide thin film. 2L FCCL has the advantages of high heat-durability, high warp resistance, and improved dimension stability. However its cost is comparatively higher. Therefore, most flexible substrates mainly use 3L FCCL, only higher level flexible substrates adopt 2L FCCL.

3L FCCL requires using epoxy resin as an adhesive between a flexible substrate and wires. However, the heat-durability of a general epoxy resin adhesive is worse than that of polyimide. Therefore, there is a temperature restriction on the use of an epoxy resin adhesive. Additionally, the reliability thereof is unsatisfactory. However, in order to meet the requirements of wire patterning, 2L FCCL also requires the steps of surface treatment, film deposition and etching whose manufacturing procedure is complicated and time-consuming.

SUMMARY

In accordance with one embodiment of the disclosure, a flexible substrate embedded with wires is provided. The flexible substrate embedded with wires comprises a flexible substrate constituted by a polymer material and a continuous wire pattern containing a plurality of pores embedded in the flexible substrate, wherein the polymer material fills the pores.

In accordance with another embodiment of the disclosure, a method for fabricating a flexible substrate embedded with wires is provided. The fabrication method comprises providing a carrier, forming a continuous wire pattern on the carrier, wherein the continuous wire pattern contains a plurality of pores, covering a polymer material over the continuous wire pattern and the carrier and to fill into the pores, and separating the polymer material and the carrier to form a flexible substrate embedded with the continuous wire pattern.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
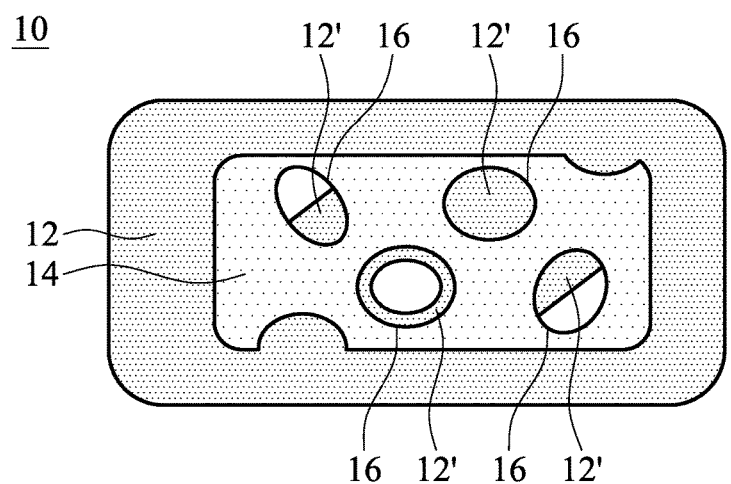
FIG. 1 is a cross-sectional view of a flexible substrate embedded with wires in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

Referring to FIG. 1, in accordance with one embodiment of the disclosure, a flexible substrate embedded with wires is provided. The flexible substrate 10 embedded with wires comprises a flexible substrate 12 and a continuous wire pattern 14. The flexible substrate 12 is constituted by a polymer material 12'. The continuous wire pattern 14 contains a plurality of pores 16 embedded in the flexible substrate 12. The polymer material 12' fills the pores 16.

The polymer material 12' may comprise polyimide (PI) or polyvinylidene fluoride (PVDF).

The wire pattern 14 may comprise, for example, silver, copper, nickel or an alloy thereof. The wire pattern 14 has a resistivity ranging from about $1.6 \times 10^{-6}$ $\Omega \cdot cm$ to about $10 \times 10^{-6}$ $\Omega \cdot cm$.

The pore 16 contained in the continuous wire pattern 14 has a size ranging from about 10 nm to about 100 μm.

In this embodiment, the continuous wire pattern 14 is embedded in an area inside the flexible substrate 12, as shown in FIG. 1.

Figure 2:
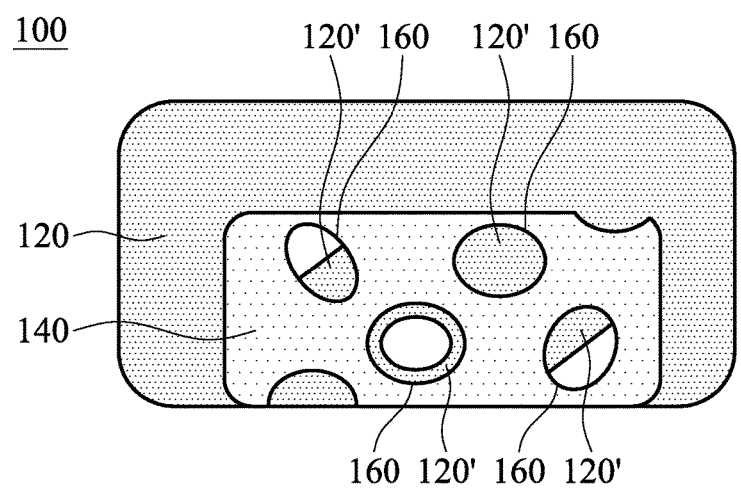
FIG. 2 is a cross-sectional view of a flexible substrate embedded with wires in accordance with one embodiment of the disclosure.

Referring to FIG. 2, in accordance with another embodiment of the disclosure, a flexible substrate embedded with wires is provided. The flexible substrate 100 embedded with wires comprises a flexible substrate 120 and a continuous wire pattern 140. The flexible substrate 120 is constituted by a polymer material 120'. The continuous wire pattern 140 contains a plurality of pores 160 embedded in the flexible substrate 120. The polymer material 120' fills the pores 160.

The polymer material 120' may comprise polyimide (PI) or polyvinylidene fluoride (PVDF).

The wire pattern 140 may comprise, for example, silver, copper, nickel or an alloy thereof. The wire pattern 140 has a resistivity ranging from about $1.6 \times 10^{-6}$ $\Omega \cdot cm$ to about $10 \times 10^{-6}$ $\Omega \cdot cm$.

The pore 160 contained in the continuous wire pattern 140 has a size ranging from about 10 nm to about 100 μm.

In this embodiment, the continuous wire pattern 140 is embedded in an area near a surface of the flexible substrate 120, as shown in FIG. 2.

Figure 3A:
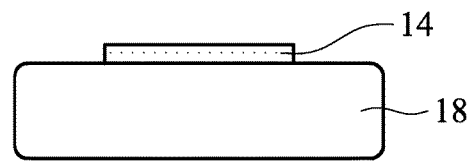
FIGS. 3A-3C are cross-sectional views of a method for fabricating a flexible substrate embedded with wires in accordance with one embodiment of the disclosure.
Figure 3B:
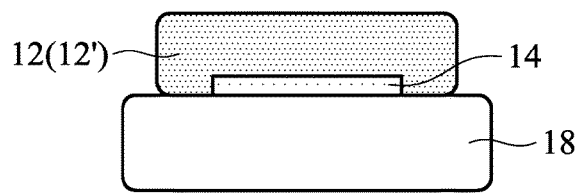
Figure 3C:
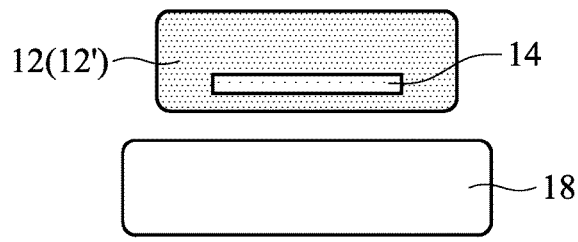

Referring to FIGS. 3A-3C, in accordance with one embodiment of the disclosure, a method for fabricating a flexible substrate embedded with wires is provided. First, as shown in FIG. 3A, a carrier 18 is provided. The carrier 18 may comprise glass or metal.

Next, a continuous wire pattern 14 is formed on the carrier 18. The continuous wire pattern 14 contains a plurality of pores (not shown). In this embodiment, the step of forming the continuous wire pattern 14 containing a plurality of pores on the carrier 18 may comprise forming the continuous wire pattern 14 on the carrier 18 using, for example, a screen printing process, and then performing a sintering process with a sintering temperature ranging from about 250° C. to about 300° C. on the continuous wire pattern 14 to form the continuous wire pattern 14 containing a plurality of pores. The wire pattern 14 may comprise, for example, silver, copper, nickel or an alloy thereof. The wire pattern 14 has a resistivity ranging from about $1.6\times10^{-6}$ Ω·cm to about $10\times10^{-6}$ Ω·cm. Additionally, the pore contained in the continuous wire pattern 14 has a size ranging from about 10 nm to about 100 μm.

In one embodiment, the step of forming a continuous wire pattern 14 on the carrier 18 comprises providing a metal glue (not shown) with a solid content ranging from about 80% to about 85%, forming a continuous pattern 14 of the metal glue on the carrier 18, and performing a sintering process on the carrier 18. The sintering process has a sintering temperature ranging from about 300° C. to about 350° C. and a sintering time ranging from about 30 min to about 40 min.

Next, a polymer material 12' is covered the continuous wire pattern 14 and the carrier 18 using, for example, a coating process, and the polymer material 12' is filled into the pores (not shown). The polymer material 12' may comprise polyimide (PI) or polyvinylidene fluoride (PVDF).

In one embodiment, the step of covering a polymer material 12' over the continuous wire pattern 14 and the carrier 18 comprises providing a polyvinylidene fluoride (PVDF) (not shown) with a solid content ranging from about 5% to about 30%, forming a polyvinylidene fluoride (PVDF) layer 12' on the continuous wire pattern 14 and the carrier 18, and performing a baking process on the carrier 18. The baking process has a baking temperature ranging from about 50° C. to about 180° C. and a baking time ranging from about 10 min to about 30 min.

In another embodiment, the step of covering a polymer material 12' over the continuous wire pattern 14 and the carrier 18 comprises providing a polyimide (PI) (not shown) with a solid content ranging from about 5% to about 40%, forming a polyimide (PI) layer 12' on the continuous wire pattern 14 and the carrier 18, and performing a baking process on the carrier 18. Specifically, the baking process has a baking temperature ranging from about 50° C. to about 210° C. and a baking time ranging from about 30 min to about 60 min.

Next, the polymer material 12' and the carrier 18 are separated using, for example, a cutting process, to form a flexible substrate 12 embedded with the continuous wire pattern 14.

In this embodiment, the continuous wire pattern 14 is embedded in an area inside the flexible substrate 12, as shown in FIG. 3C.

Figure 4A:
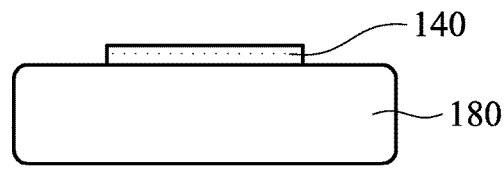
FIGS. 4A-4D are cross-sectional views of a method for fabricating a flexible substrate embedded with wires in accordance with one embodiment of the disclosure.
Figure 4B:
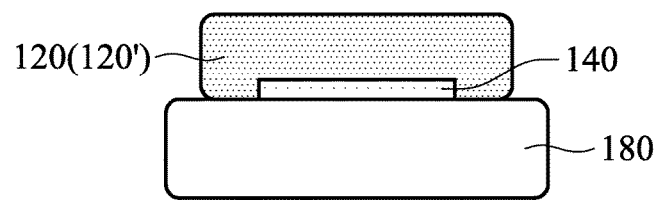
Figure 4C:
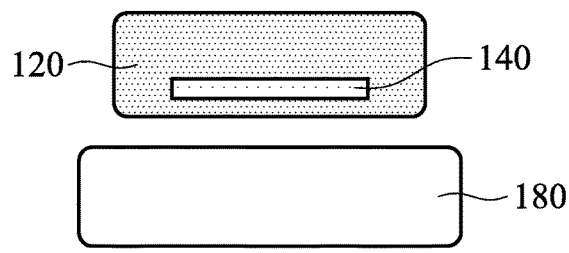

Referring to FIGS. 4A-4D, in accordance with one embodiment of the disclosure, a method for fabricating a flexible substrate embedded with wires is provided. First, as shown in FIG. 4A, a carrier 180 is provided. The carrier 180 may comprise glass or metal.

Next, a continuous wire pattern 140 is formed on the carrier 180. The continuous wire pattern 140 contains a plurality of pores (not shown). In this embodiment, the step of forming the continuous wire pattern 140 containing a plurality of pores on the carrier 180 may comprise forming the continuous wire pattern 140 on the carrier 180 using, for example, a screen printing process, and then performing a sintering process with a sintering temperature ranging from about 250° C. to about 300° C. on the continuous wire pattern 140 to form the continuous wire pattern 140 containing a plurality of pores. The wire pattern 140 may comprise, for example, silver, copper, nickel or an alloy thereof. The wire pattern 140 has a resistivity ranging from about $1.6\times10^{-6}$ Ω·cm to about $10\times10^{-6}$ Ω·cm. The pore contained in the continuous wire pattern 140 has a size ranging from about 10 nm to about 100 μm.

Next, a polymer material 120' covers the continuous wire pattern 140 and the carrier 180 using, for example, a coating process, and the polymer material 120' is filled into the pores (not shown). The polymer material 120' may comprise polyimide (PI) or polyvinylidene fluoride (PVDF).

Next, the polymer material 120' and the carrier 180 are separated using, for example, a cutting process, to form a flexible substrate 120 embedded with the continuous wire pattern 140.

Next, a surface treatment process 200, for example, a plasma process, is performed on the flexible substrate 120 embedded with the continuous wire pattern 140 to expose the continuous wire pattern 140.

Figure 4D:
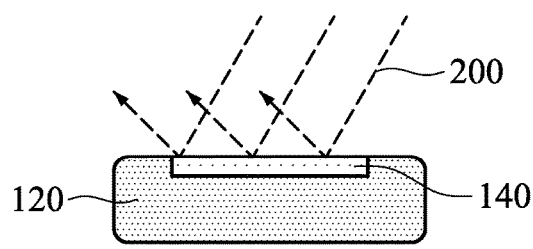

In this embodiment, the continuous wire pattern 140 is embedded in an area near a surface of the flexible substrate 120, as shown in FIG. 4D.

In the disclosure, a full-printing substrate structure design which is capable of embedding metal wires in a flexible substrate is developed which resolves the current problems of poor reliability and poor adhesion force between the substrate and wires, and the simplicity of its manufacturing procedure provides optimal benefits. As such it has been widely applied to flexible electronics, flexible printed circuits, LEDs, and related industries. In the disclosure, the flexible substrate structure embedded with metal wires exhibits poor adhesion force between the metal wires and the carrier, and after the used polymer material is coated and shaped, the polymer material and the metal wires are capable of easily being taken down from the carrier to form the polymer material embedded with metal wires which possess high warp resistance in structure and high adhesion force between the substrate and the wires, such that it is not easy to peel the wires off the substrate.

In the disclosed flexible substrate structure, the polymer material fills and penetrates the pores of the wires such that the metal wires are effectively coated by the polymer material, resulting in the metal wires being buried inside the polymer substrate or embedded near a surface of the polymer substrate which gives the metal wires the characteristics of heat-durability, soldering resistance, warp resistance, reduced thickness and rapid electronic conduction, etc. In addition, the novel flexible substrate conductor circuit structure developed by the disclosure is capable of being applied in the formation of ultra-thin polymer substrate and circuits, achieving a reduced thickness of the overall integration, also effectively being applied to flexible displays such as flexible LED package substrates, touch panels, displays, etc. Additionally, this structure can also be applied to the adhesion of high-power electronic chips and reduce the thickness of packaging and electronic circuits.

EXAMPLES

Example 1

Preparation of the Flexible Substrate Embedded with Wires (1) and Analysis of the Characteristics Thereof Referring to FIGS. 3A-3C, first, as shown in FIG. 3A, a carrier 18 was provided. The carrier 18 comprised glass.

Next, a continuous wire pattern 14 was formed on the carrier 18. The continuous wire pattern 14 contained a plurality of pores (not shown). In this example, the step of forming the continuous wire pattern 14 containing a plurality of pores on the carrier 18 comprised dissolving $C_{11}H_{23}OOAg$ (8 g) in xylene (16 ml) to form a solution, blending the solution with spherical metallic silver powder with a size ranging from 100 nm to 300 nm (40 g) to prepare a conductive silver glue (with a viscosity of 100,000 cp.) with a solid content of 85%, forming the continuous wire pattern 14 on the carrier 18 using a screen printing process (mesh: 325), and performing a sintering process with a sintering temperature of about 300° C. on the continuous wire pattern 14 for about 30 min to form the continuous wire pattern 14 containing a plurality of pores. The pore contained in the continuous wire pattern 14 had a size ranging from 10 nm to 100 μm.

Next, a polymer material 12' covered the continuous wire pattern 14 and the carrier 18 using a coating process, and the polymer material 12' was filled into the pores (not shown). In this example, the step of covering the polymer material 12' over the continuous wire pattern 14 and the carrier 18 comprised coating a polyimide (PI) solution with a solid content of about 20% (dissolving 6 g of PI in 24 ml of dimethylacetamide to form a solution) on the continuous wire pattern 14 and the carrier 18 using a 300-μm scraper to form a polyimide (PI) film and performing a baking process on the polyimide (PI) film to obtain a transparent polyimide (PI) thin film. In the baking process, the polyimide (PI) film was baked at 50° C. for 30 min, at 140° C. for 30 min, and at 210° C. for 60 min.

Next, the polymer material 12' and the carrier 18 were separated using a cutting process to form a flexible substrate 12 embedded with the continuous wire pattern 14. The cutting process was a simple mechanical cutting process.

In this example, the continuous wire pattern 14 was embedded in an area inside the flexible substrate 12, as shown in FIG. 3C.

Next, the characteristics (adhesion force between the flexible substrate and the wire, resistivity of the wire) of the flexible substrate embedded with wires prepared by this example were analyzed, and deflection and solder tests thereof were also performed. The results are shown in Table 1.

Example 2

Preparation of the Flexible Substrate Embedded with Wires (2) and Analysis of the Characteristics Thereof Referring to FIGS. 3A-3C, first, as shown in FIG. 3A, a carrier 18 was provided. The carrier 18 comprised stainless steel.

Next, a continuous wire pattern 14 was formed on the carrier 18. The continuous wire pattern 14 contained a plurality of pores (not shown). In this example, the step of forming the continuous wire pattern 14 containing a plurality of pores on the carrier 18 comprised dissolving $C_{11}H_{23}OOAg$ (8 g) in xylene (16 ml) to form a solution, blending the solution with spherical metallic silver powder with a size ranging from 100 nm to 300 nm (40 g) to prepare a conductive silver glue (with a viscosity of 100,000 cp.) with a solid content of 85%, forming the continuous wire pattern 14 on the carrier 18 using a screen printing process (mesh: 325), and performing a sintering process with a sintering temperature about 300° C. on the continuous wire pattern 14 for about 30 min to form the continuous wire pattern 14 containing a plurality of pores. The pore contained in the continuous wire pattern 14 had a size ranging from 10 nm to 100 μm.

Next, a polymer material 12' covered the continuous wire pattern 14 and the carrier 18 using a coating process, and the polymer material 12' was filled into the pores (not shown). In this example, the step of covering the polymer material 12' over the continuous wire pattern 14 and the carrier 18 comprised coating a polyvinylidene fluoride (PVDF) solution with a solid content of about 15% (dissolving 6 g of PVDF in 34 ml of dimethylacetamide to form a solution) on the continuous wire pattern 14 and the carrier 18 using a 500-μm scraper to form a polyvinylidene fluoride (PVDF) film and performing a baking process on the polyvinylidene fluoride (PVDF) film to obtain a transparent polyvinylidene fluoride (PVDF) thin film. In the baking process, the polyvinylidene fluoride (PVDF) film was baked at 80° C. for 10 min and at 180° C. for 30 min.

Next, the polymer material 12' and the carrier 18 were separated using a cutting process to form a flexible substrate 12 embedded with the continuous wire pattern 14. The cutting process was a simple mechanical cutting process.

In this example, the continuous wire pattern 14 was embedded in an area inside the flexible substrate 12, as shown in FIG. 3C.

Next, the characteristics (adhesion force between the flexible substrate and the wire, resistivity of the wire) of the flexible substrate embedded with wires prepared by this example were analyzed, and deflection and solder tests thereof were also performed. The results are shown in Table 1.

Example 3

Preparation of the Flexible Substrate Embedded with Wires (3) and Analysis of the Characteristics Thereof Referring to FIGS. 4A-4D, first, as shown in FIG. 4A, a carrier 180 was provided. The carrier 180 comprised glass.

Next, a continuous wire pattern 140 was formed on the carrier 180. The continuous wire pattern 140 contained a plurality of pores (not shown). In this example, the step of forming the continuous wire pattern 140 containing a plurality of pores on the carrier 180 comprised dissolving $C_{11}H_{23}OOAg$ (8 g) in xylene (16 ml) to form a solution, blending the solution with spherical metallic silver powder with a size ranging from 100 nm to 300 nm (40 g) to prepare a conductive silver glue (with a viscosity of 100,000 cp.) with a solid content of 85%, forming the continuous wire pattern 140 on the carrier 180 using a screen printing process (mesh: 325), and performing a sintering process with a sintering temperature of 300° C. on the continuous wire pattern 140 for about 30 min to form the continuous wire pattern 140 containing a plurality of pores. The pore contained in the continuous wire pattern 140 had a size ranging from 10 nm to 100 μm.

Next, a polymer material 120' covered the continuous wire pattern 140 and the carrier 180 using a coating process, and the polymer material 120' was filled into the pores (not shown). In this example, the step of covering the polymer material 120' over the continuous wire pattern 140 and the carrier 180 comprised coating a polyimide (PI) solution with a solid content of about 20% (dissolving 6 g of PI in 24 ml of dimethylacetamide to form a solution) on the continuous wire pattern 140 and the carrier 180 using a 300-μm scraper to form a polyimide (PI) film and performing a baking process on the polyimide (PI) film to obtain a transparent polyimide (PI) thin film. In the baking process, the polyimide (PI) film was baked at 50° C. for 30 min, at 140° C. for 30 min, and at 210° C. for 60 min.

Next, the polymer material 120' and the carrier 180 were separated using a cutting process to form a flexible substrate 120 embedded with the continuous wire pattern 140. The cutting process was a simple mechanical cutting process.

Next, a surface treatment process 200 was performed on the flexible substrate 120 embedded with the continuous wire pattern 140 to expose the continuous wire pattern 140. The surface treatment process 200 was a plasma process.

In this example, the continuous wire pattern 140 was embedded in an area near a surface of the flexible substrate 120, as shown in FIG. 4D.

Next, the characteristics (adhesion force between the flexible substrate and the wire, resistivity of the wire) of the flexible substrate embedded with wires prepared by this example were analyzed, and deflection and solder tests thereof were also performed. The results are shown in Table 1.

Comparative Example 1

Preparation of a Conventional Flexible Substrate with Wires Formed Thereon and Analysis of the Characteristics Thereof First, a substrate was provided. The substrate comprised polyimide (PI).

Next, a wire pattern was formed on the substrate. In this example, the step of forming the wire pattern on the substrate comprised dissolving $C_{11}H_{23}OOAg$ in xylene to form a solution, blending the solution with spherical metallic silver powder with a size ranging from 100 nm to 300 nm to prepare a conductive silver glue with a solid content of 85%, and then forming the wire pattern on the substrate using a screen printing process (mesh: 325).

Next, the characteristics (adhesion force between the flexible substrate and the wire, resistivity of the wire) of the flexible substrate with wires formed thereon prepared by this example were analyzed, and deflection and solder tests thereof were also performed. The results are shown in Table 1.

TABLE 1

| Example/Com. Example | Adhesion force between flexible substrate and wire (B) | Resistivity ($\Omega \cdot cm$) | Deflection test (R = 0.38 cm/1,000 times) | Solder test (>280° C.) |
| --- | --- | --- | --- | --- |
| Example 1 | 5 | $6 \times 10^{-6}$ | Pass | Pass |
| Example 2 | 5 | $6 \times 10^{-6}$ | Pass | Pass |
| Example 3 | 5 | $6 \times 10^{-6}$ | Pass | Pass |
| Com. Example 1 | 1 | $6 \times 10^{-5}$ | No Pass | No Pass |

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. A flexible substrate embedded with wires, comprising:
a flexible substrate constituted by a polymer material; and
a continuous wire pattern containing a plurality of pores embedded in the flexible substrate, wherein the polymer material fills the pores.

2. The flexible substrate embedded with wires as claimed in claim 1, wherein the polymer material comprises polyimide (PI) or polyvinylidene fluoride (PVDF).

3. The flexible substrate embedded with wires as claimed in claim 1, wherein the wire pattern comprises silver, copper, nickel or an alloy thereof.

4. The flexible substrate embedded with wires as claimed in claim 1, wherein the wire pattern has a resistivity ranging from $1.6 \times 10^{-6}$ $\Omega \cdot cm$ to $10 \times 10^{-6}$ $\Omega \cdot cm$.

5. The flexible substrate embedded with wires as claimed in claim 1, wherein the pore has a size ranging from 10 nm to 100 μm.

6. The flexible substrate embedded with wires as claimed in claim 1, wherein the continuous wire pattern is embedded in an area inside the flexible substrate.

7. The flexible substrate embedded with wires as claimed in claim 1, wherein the continuous wire pattern is embedded in an area near a surface of the flexible substrate.

8. A method for fabricating a flexible substrate embedded with wires, comprising:
providing a carrier;
forming a continuous wire pattern on the carrier, wherein the continuous wire pattern contains a plurality of pores;
covering a polymer material over the continuous wire pattern and the carrier and to fill into the pores; and
separating the polymer material and the carrier to form a flexible substrate embedded with the continuous wire pattern.

9. The method for fabricating a flexible substrate embedded with wires as claimed in claim 8, wherein the carrier comprises glass or metal.

10. The method for fabricating a flexible substrate embedded with wires as claimed in claim 8, further comprising performing a surface treatment process on the flexible substrate embedded with the continuous wire pattern.

11. The method for fabricating a flexible substrate embedded with wires as claimed in claim 8, wherein the step of forming a continuous wire pattern on the carrier comprises:
providing a metal glue with a solid content ranging from 80% to 85%;
forming a continuous pattern of the metal glue on the carrier; and
performing a sintering process on the carrier, wherein the sintering process has a sintering temperature ranging from 300° C. to 350° C. and a sintering time ranging from 30 min to 40 min.

12. The method for fabricating a flexible substrate embedded with wires as claimed in claim 8, wherein the step of covering a polymer material over the continuous wire pattern and the carrier comprises:
providing a polyvinylidene fluoride (PVDF) with a solid content ranging from 5% to 30%;
forming a polyvinylidene fluoride (PVDF) layer on the continuous wire pattern and the carrier; and
performing a baking process on the carrier, wherein the baking process has a baking temperature ranging from 50° C. to 180° C. and a baking time ranging from 10 min to 30 min.

13. The method for fabricating a flexible substrate embedded with wires as claimed in claim 8, wherein the step of covering a polymer material over the continuous wire pattern and the carrier comprises:

providing a polyimide (PI) with a solid content ranging from 5% to 40%;

forming a polyimide (PI) layer on the continuous wire pattern and the carrier; and performing a baking process on the carrier, wherein the baking process has a baking temperature ranging from 50° C. to 210° C. and a baking time ranging from 30 min to 60 min.

* * * * *